(12) United States Patent
Lei et al.

(10) Patent No.: US 8,539,391 B2
(45) Date of Patent: Sep. 17, 2013

(54) EDGE FRAGMENT CORRELATION DETERMINATION FOR OPTICAL PROXIMITY CORRECTION

(75) Inventors: Junjiang Lei, Bellevue, WA (US); Le Hong, West Linn, OR (US); Mei-Fang Shen, Chupei (TW); YiNing Pan, Zhubei (TW)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/363,343

(22) Filed: Jan. 31, 2012

(65) Prior Publication Data

US 2013/0198698 A1    Aug. 1, 2013

(51) Int. Cl.
  *G06F 17/50*    (2006.01)
(52) U.S. Cl.
  USPC ............... 716/53; 716/50; 716/52; 716/54; 716/55; 716/56; 430/5; 430/30
(58) Field of Classification Search
  USPC .................... 716/50–56; 430/5, 30
  See application file for complete search history.

(56) References Cited

U.S. PATENT DOCUMENTS

2007/0124708 A1*  5/2007  Torres Robles et al. .......... 716/4
2011/0179393 A1*  7/2011  Xue et al. ........................ 716/55

OTHER PUBLICATIONS

"Model-based OPC using the MEEF matrix", by Nick Cobb and Yuri Granik, 22nd Annual BACUS Symposium on Photomask Technology, Proceeding of SPIE vol. 4889 @2002.*
Cobb, "Fast Optical and Process Proximity Correction Algorithms for Integrated Circuit Manufacturing," A Ph.D. Dissertation, University of California at Berkeley, 1998, 140 pages.
Schellenberg, "Resolution Enhancement Technology: The Past, the Present, and Extensions for the Future," Optical Microlithography XVII, edited by Bruce W. Smith, Proceedings of SPIE, vol. 5377, 20 pages, @2004.

* cited by examiner

*Primary Examiner* — Nha Nguyen
(74) *Attorney, Agent, or Firm* — Klarquist Sparkman, LLP

(57) ABSTRACT

Aspects of the invention relate to techniques for determining edge fragment correlation information. With various implementations of the invention, image intensity slope information for edge fragments in a layout design is determined. The image intensity slope information comprises information describing how image intensity for each of the edge fragments changes with its position. Image amplitude sensitivity information for the edge fragments is also determined. The image amplitude sensitivity information comprises information describing how image amplitude for each of the edge fragments changes with positions of neighboring edge fragments. Based on the image intensity slope information and the image amplitude sensitivity information, edge fragment correlation information for the edge fragments is determined. Using the edge fragment correlation information, the layout design may be processed by using, for example, OPC techniques. This OPC process may be performed on the whole layout design or problematic layout regions identified by a conventional OPC process.

21 Claims, 6 Drawing Sheets

Flow chart
600

Flow chart
600

EDGE FRAGMENT CORRELATION DETERMINATION FOR OPTICAL PROXIMITY CORRECTION

FIELD OF THE INVENTION

The present invention relates to the field of lithography. Various implementations of the invention may be particularly useful for optical proximity correction.

BACKGROUND OF THE INVENTION

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, such as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or polylines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, "optical proximity correction" or "optical process correction" (OPC), adjusts the amplitude of the light transmitted through a lithographic mask by modifying the design layout data employed to create the mask.

In a conventional OPC process, the edges of the geometric elements in the design are fragmented. For example, as shown in FIG. 3A, an edge of the geometric element 301 used to create a mask feature 300 may be fragmented into edge fragments 301A-301F. The size of the edge fragments in a given layout design depends upon the OPC process parameters, often referred to as the OPC recipe. The "recipe" specifies the size of the edge fragments. Not all edges within a layout design are fragmented in every OPC process.

The model-based OPC process also simulates the printed image. That is, the photolithographic process is simulated in order to produce a simulated printed image, such as the example image 302 shown in FIG. 3A. This simulated image is compared to the target image. Typically, this comparison is done at each edge fragment. For example, as shown in FIG. 3C, the target image is a distance d1 away from the simulated printed image at the edge fragment 301A, the target image is a distance d2 away from the simulated printed image at the edge fragment 301C, while the target image intersects the simulated printed image at the edge fragment 301B. The distances between the target image and the simulated printed image are often referred to as the edge placement error (EPE). Accordingly, in most conventional model-based OPC processes each edge fragment or unfragmented edge has an associated edge placement error.

Next, the edge fragments are individually moved in order to improve the resolution of the simulated printed image for the resulting mask. For example, as shown in FIG. 3D, the edge fragment 201A is displaced in a direction away from the geometric element 301, in an effort to widen the corresponding portion of the image that would be produced by the resulting mask. Similarly, the edge fragment 301C is displaced in a direction toward from the geometric element 301, in an effort to narrow the corresponding portion of the image that would be produced by the resulting mask. Next, the image that would be produced by a mask using the displaced edge fragments is simulated, and the new simulated image is compared with the target image, and the edge placement errors for each edge fragment are computed.

This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the OPC process. Typically, edge fragments moved during a given iteration, and the distance the edge fragments are displaced, are determined based upon the edge placement error. For example, because d1 is larger than d2 in FIG. 3C, a subsequent iteration of the optical proximity correction process may move edge fragment 301A a greater amount than edge fragment 301C.

Traditionally, the movement value for each edge fragment may be the edge placement error multiplied by a constant factor (feedback factor). The OPC iteration process continues until the simulated image is sufficiently similar to the target image (e.g., both d1 and d2 are smaller than a threshold value), or until it is determined that the displacements of the edge fragments already have converged on locations where no further movement of the edge fragments will improve the simulated image. Once the final positions of the edge fragments are determined in the layout design data, as shown in FIG. 3D, a modified mask feature 303 can be created from the corrected layout design data. As shown in FIG. 3D, the image 304 produced by the modified mask feature 303 should more closely correspond to the target image.

The traditional approach was successful at earlier technology nodes where the EPE of a given fragment was primarily governed by its own displacement, and not so much by the movement of other neighboring fragments. However, OPC convergence is substantially more difficult to achieve in advanced technology nodes such as 28 nm and below. The influence of many neighboring fragments on any particular fragment increases significantly because the size of a whole printed geometric element may be a fraction of the exposure light wavelength. While an increased number of OPC iterations may help, more OPC iterations results in very long OPC runtime. Moreover, OPC convergence may not be achieved in some locations no matter how many OPC iterations are employed. Edge fragment correlation information such as the cross-Mask Error Enhancement Factor (cross-MEEF) may be employed to improve OPC convergence. Challenges still remain in speeding up edge fragment correlation determination process.

BRIEF SUMMARY OF THE INVENTION

Aspects of the invention relate to techniques for determining edge fragment correlation information. With various implementations of the invention, image intensity slope information for edge fragments in a layout design is determined. The image intensity slope information comprises information describing how image intensity for each of the edge fragments changes with its position. The image intensity slope information may be derived based on current image intensity profiles or image intensity information at different edge displacement error values determined previously. Image amplitude sensitivity information for the edge fragments is also determined. The image amplitude sensitivity information comprises information describing how image amplitude for each of the edge fragments changes with positions of neighboring edge fragments. The determination of the image amplitude sensitivity information may comprise employing a Gaussian function. Based on the image intensity slope information and the image amplitude sensitivity information, edge fragment correlation information for the edge fragments is determined. The edge fragment correlation information may comprise information of cross-mask error enhancement factor. Using the edge fragment correlation information, the layout design may be processed by using, for example, OPC techniques. This OPC process may be performed on the whole layout design or problematic layout regions identified by for example, a conventional OPC process.

DETAILED DESCRIPTION OF THE INVENTION

General Considerations

Figure 1:
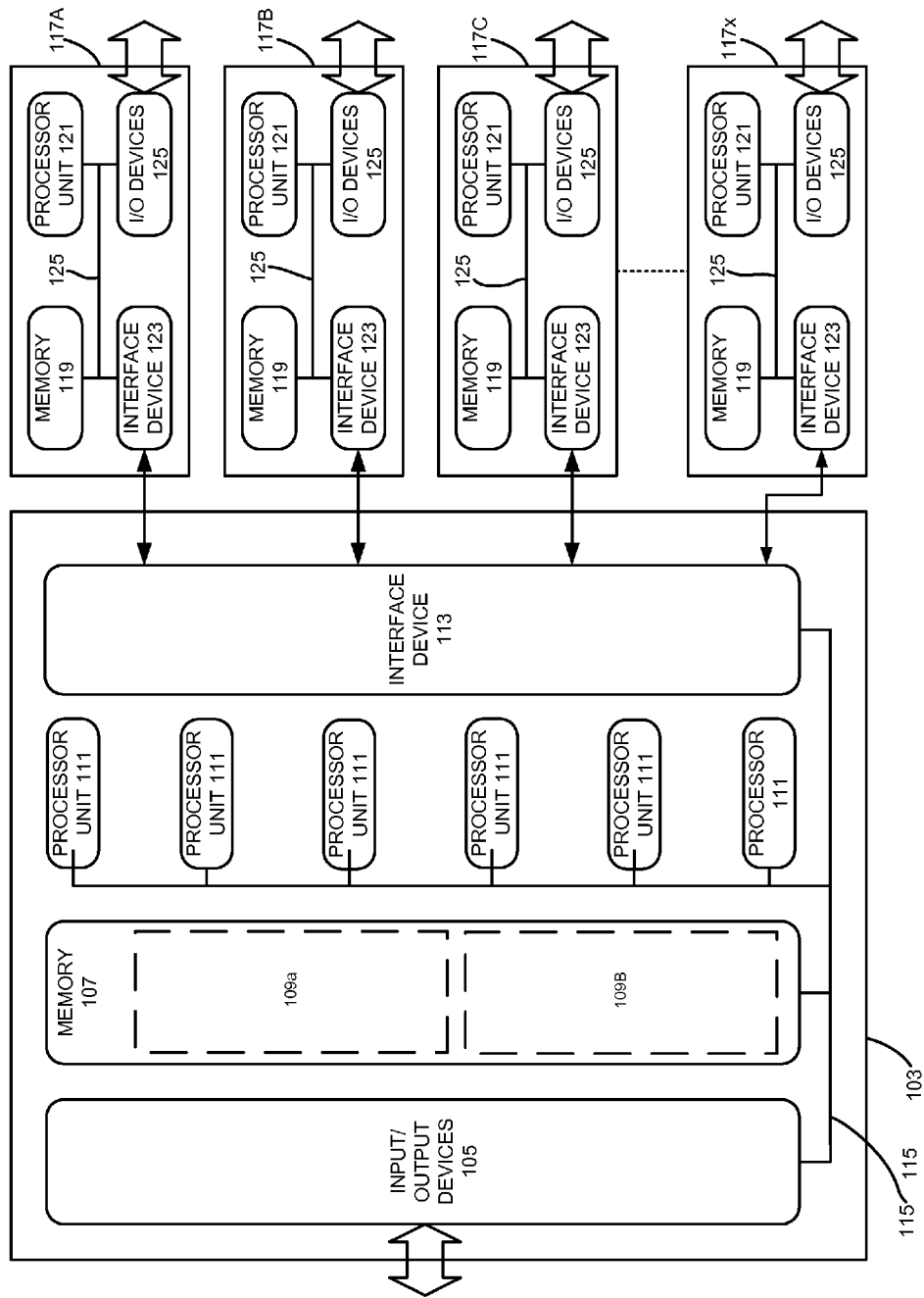
FIG. 1 illustrates an example of a computing system that may be used to implement various embodiments of the invention.

Various aspects of the present invention relate to techniques for determining edge fragment correlation information. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "process" and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Exemplary Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
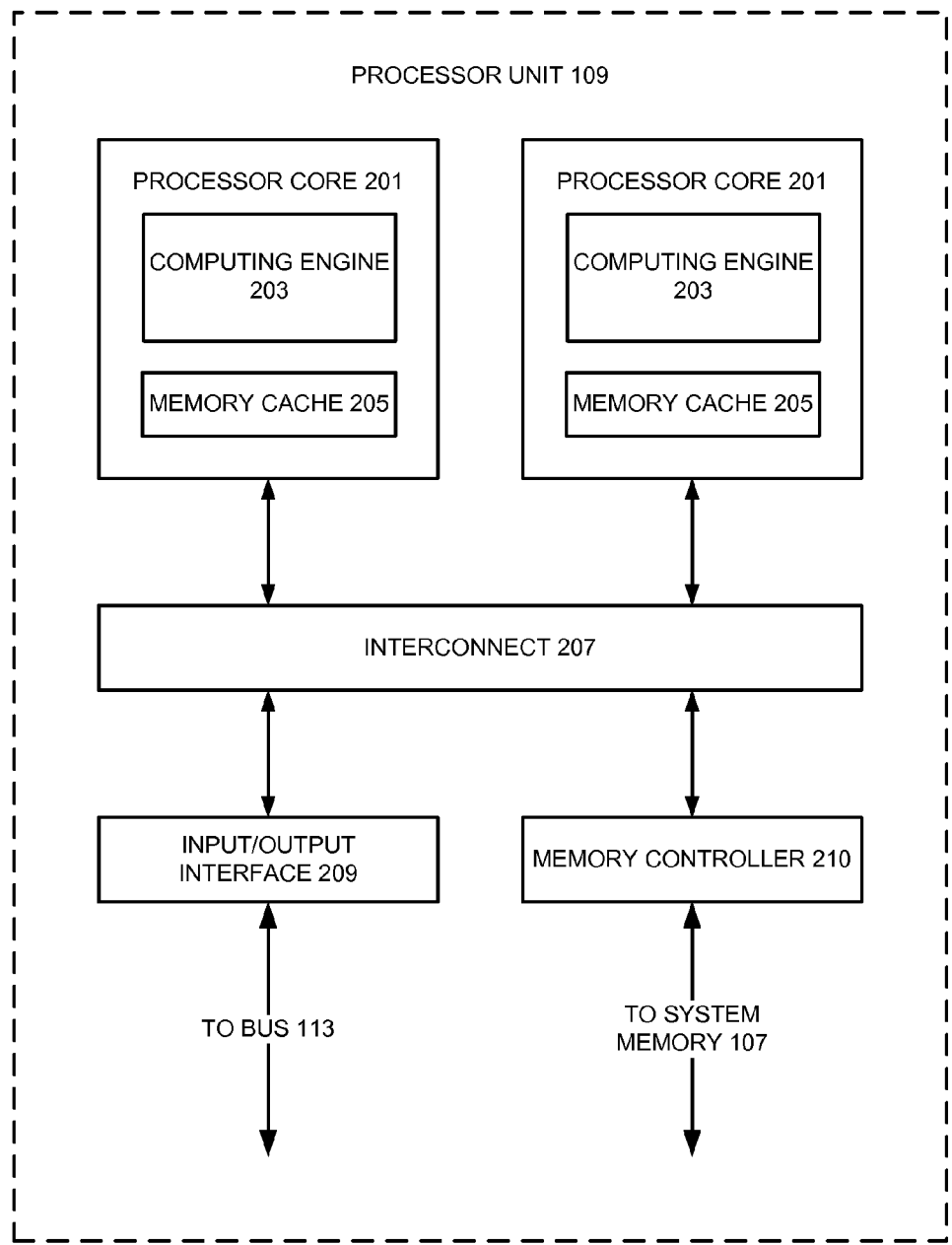
FIG. 2 illustrates an example of a multi-core processor unit that may be used to implement various embodiments of the invention.
Figure 3A:
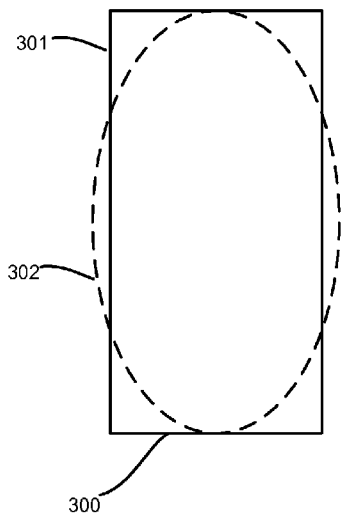
FIG. 3A illustrates a mask feature 300 and a simulated image of the mask feature.
Figure 3C:
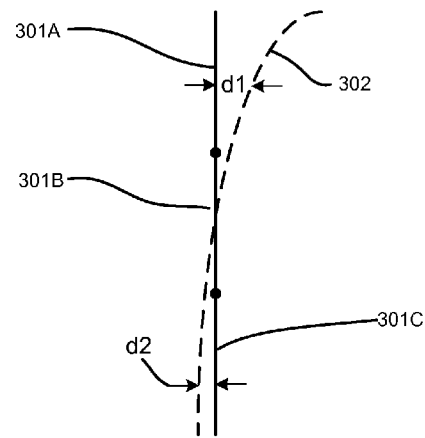
FIG. 3C illustrates edge displacement errors for some of the edge fragments.
Figure 3B:
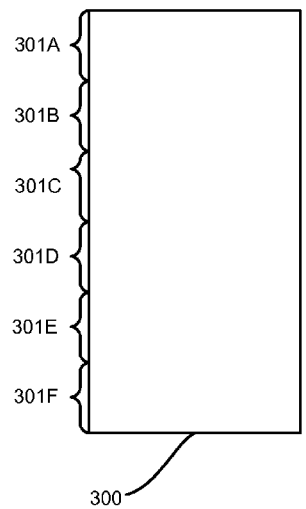
FIG. 3B illustrates an example of fragmentation of an edge of the mask feature 300.
Figure 3D:
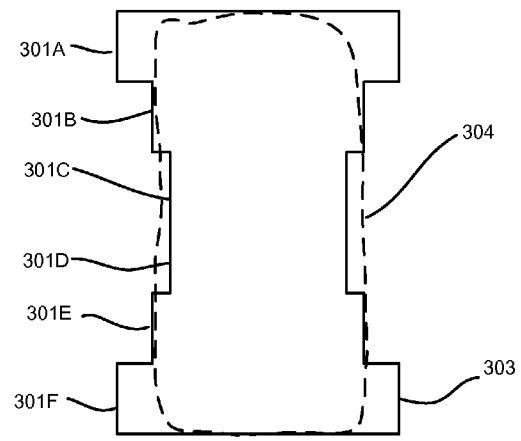
FIG. 3D illustrates a mask feature modified from the mask feature 300 by an OPC process and a corresponding simulated image.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

At also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Cross-Mask Error Enhancement Factor

The mask error enhancement factor (MEEF) is used to describe the deviation from the idea pattern found on the reticle, to the deviation produced in the corresponding patterning pattern on the wafer. This is mathematically expressed as:

$$MEEF = \frac{\partial CD_{wafer}}{\partial (CD_{reticle}/M)} \quad [1]$$

where M is the imaging system reduction ratio. For an ideal linear imaging system, MEEF=1.0. In practice, process-related and mask-related variables can significantly enhance the MEEF as the image fidelity of the system deteriorates.

As noted above, the movement value for each edge fragment during an OPC iteration may be the edge placement error multiplied by a constant factor (feedback factor). This feedback factor may be derived based on the MEEF. In traditional OPC processes, the MEEF is usually determined without considering proximity interactions between features. To account for the proximity interactions, the MEEF may be represented by a matrix:

$$MEEM \equiv F'(0) = \begin{bmatrix} \frac{\partial w_1}{\partial m_1} & \frac{\partial w_1}{\partial m_2} & \cdots & \frac{\partial w_1}{\partial m_n} \\ \frac{\partial w_2}{\partial m_1} & \frac{\partial w_2}{\partial m_2} & \cdots & \frac{\partial w_2}{\partial m_n} \\ \cdots & \cdots & \cdots & \cdots \\ \frac{\partial w_r}{\partial m_1} & \frac{\partial w_r}{\partial m_2} & \cdots & \frac{\partial w_r}{\partial m_n} \end{bmatrix} \quad [2]$$

where $\partial m_1, \partial m_2, \ldots \partial m_n$ are mask distortions (or $dCD_{reticle}$) for features 1-n and $\partial w_1, \partial w_2, \ldots \partial w_r$ are image distortions (or $dCD_{wafer}$) for features 1-r. The coefficients $\partial w_i/\partial m_i$ are coefficients of error self-enhancements describe the influence of mask edge shifts on the corresponding wafer edges—employed by traditional OPC processes. They are usually positioned diagonally in the matrix. Off-diagonal elements $\partial w_i/\partial m_j$ are coefficients of cross-enhancements, characterizing the influence of mask edge shifts on the neighboring wafer edges—edge fragment correlation. These off-diagonal elements are often referred to as cross-MEEF. A MEEF matrix is usually a diagonal dominant matrix because self-enhancement is a stronger phenomenon than cross-enhancement.

Figure 4:
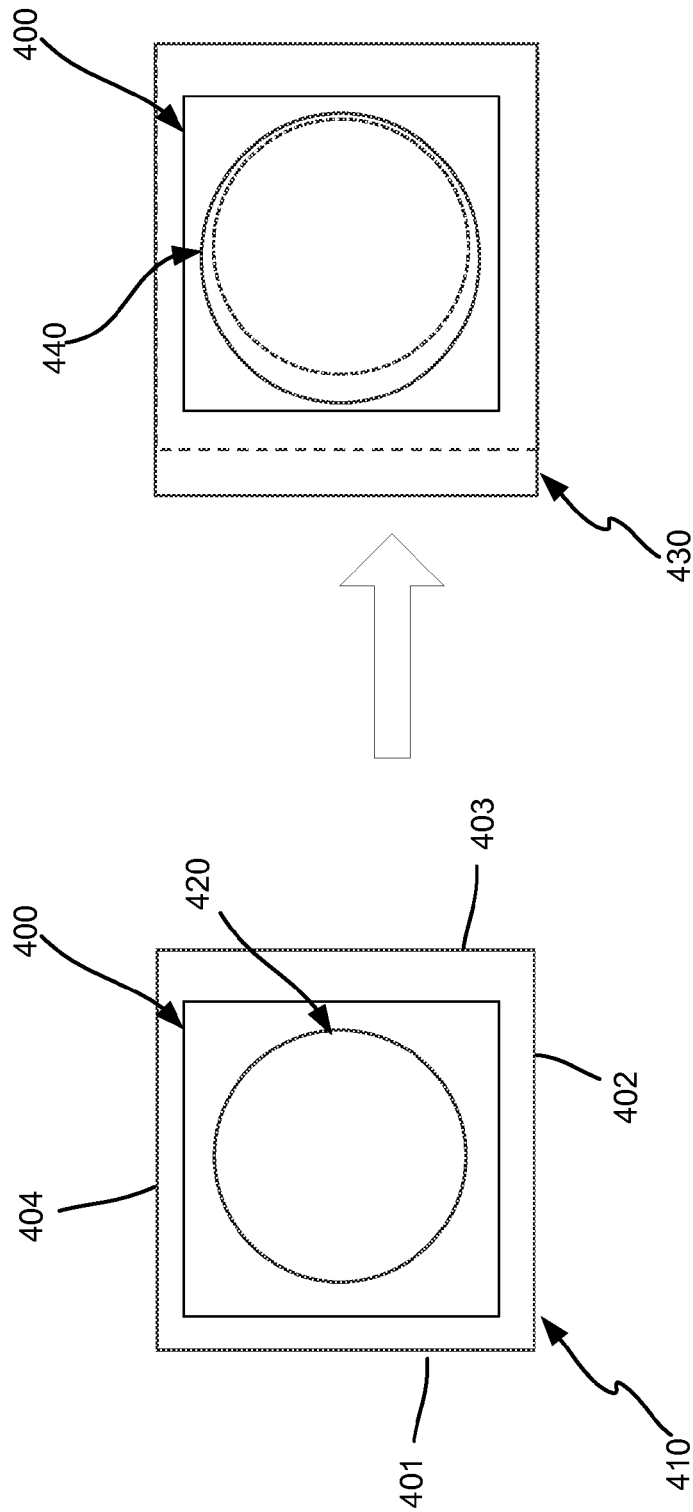
FIG. 4 illustrates an example how displacing one edge fragment can affect printed images of neighboring edge fragments.

FIG. 4 illustrates an example of edge fragment correlation. Square 400, square 410 and circle 420 are a target wafer feature, a corresponding mask feature and a simulated wafer feature, respectively. If edge 401 of the square 410 is moved outward by 1 nm, the mask feature becomes square 430 and corresponding simulated wafer feature becomes feature 440. As a result, EPE changes for edges 401-404 are 0.5 nm, 0.2 nm, 0.1 nm and 0.2 nm, respectively. This illustrates edge fragment correlation—the movement of edge 401 causes EPE changes for all four edges 401-404. This process may be represented by an equation including a MEEF matrix:

$$\begin{pmatrix} 0.5 & 0.2 & 0.1 & 0.2 \\ 0.2 & 0.5 & 0.2 & 0.1 \\ 0.1 & 0.2 & 0.5 & 0.2 \\ 0.2 & 0.1 & 0.2 & 0.5 \end{pmatrix} * \begin{pmatrix} m1 \\ m2 \\ m3 \\ m4 \end{pmatrix} = \begin{pmatrix} -epe1 \\ -epe2 \\ -epe3 \\ -epe4 \end{pmatrix} \quad [3]$$

Eq. 3 shows mask edge displacements may be derived based on desired EPEs and a corresponding MEEF matrix. To determine the MEEF, the cross-MEEF needs to be determined first.

The cross-MEEF may be determined by using an equation or by simulation. Yet, both approaches are computationally intensive. With various implementations of the invention, the cross-MEEF may be determined based on image intensity slope information and image amplitude sensitivity information as discussed in detail below.

Edge Fragment Correlation Determination Tools And Methods

Figure 5:
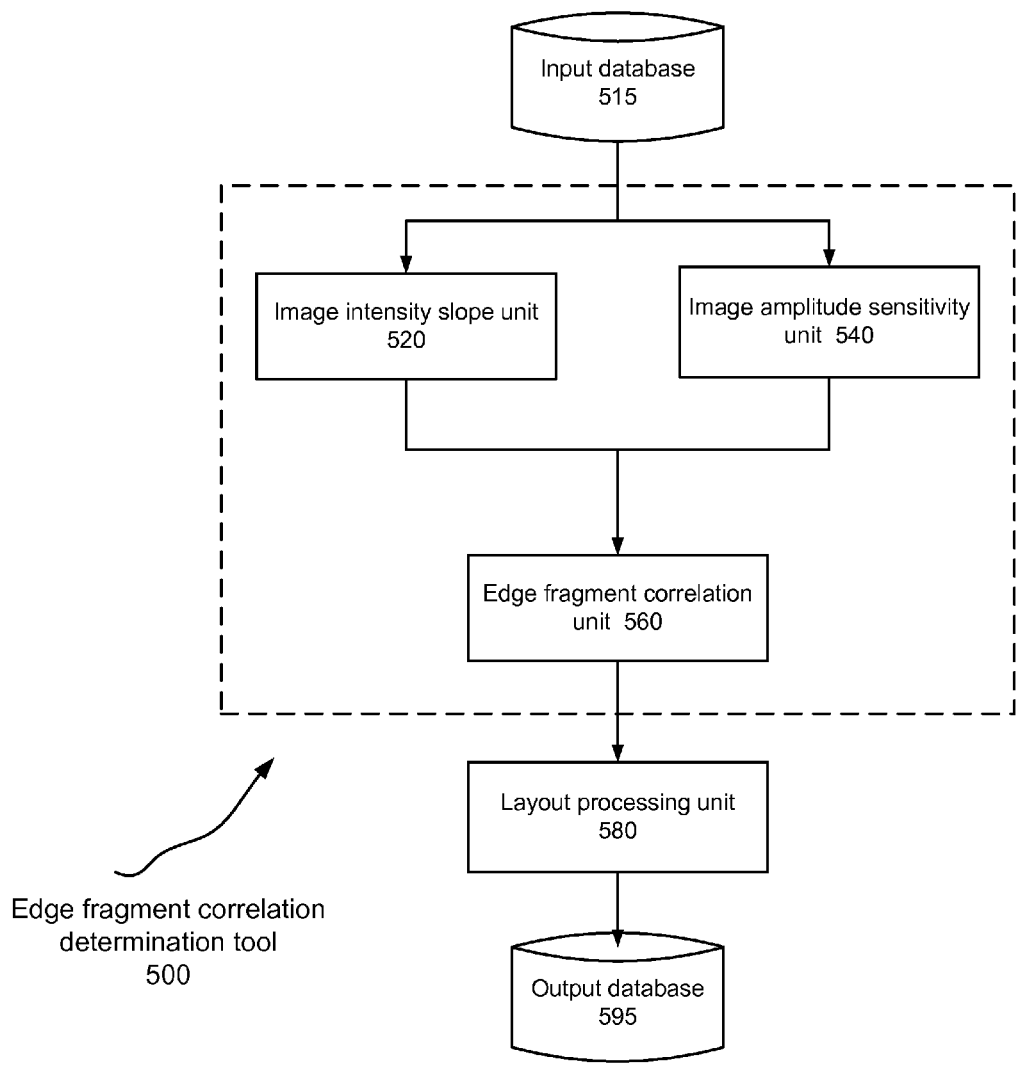
FIG. 5 illustrates an example of an edge fragment correlation determination tool that may be employed according to various embodiments of the invention.

FIG. 5 illustrates an example of an edge fragment correlation determination tool according to various embodiments of the invention. As seen in the figure, the edge fragment correlation determination tool 500 includes three units: an image intensity slope unit 520, an image amplitude sensitivity unit 540, and an edge fragment correlation unit 560. As will be discussed in more detail below, some implementations of the edge fragment correlation determination tool 500 may cooperate with (or incorporate) one or more of an input database 515, an output database 595, and a layout processing unit 580. While the input database 515 and the output database 395 are shown as separate units in FIG. 5, a single data storage medium may be used to implement some or all of these databases.

According to some embodiments of the invention, one or more of the image intensity slope unit 520, the image amplitude sensitivity unit 540, the edge fragment correlation unit 560, and the layout processing unit 580 may be implemented by executing programming instructions on one or more programmable computers/computer systems, such as the computing system illustrated in FIG. 1 and FIG. 2. Correspondingly, some other embodiments of the invention may be implemented by software instructions, stored on a non-transitory computer-readable medium, for instructing one or more programmable computers/computer systems to perform the functions of one or more of the image intensity slope unit 520, the image amplitude sensitivity unit 540, the edge fragment correlation unit 560, and the layout processing unit 580. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 6:
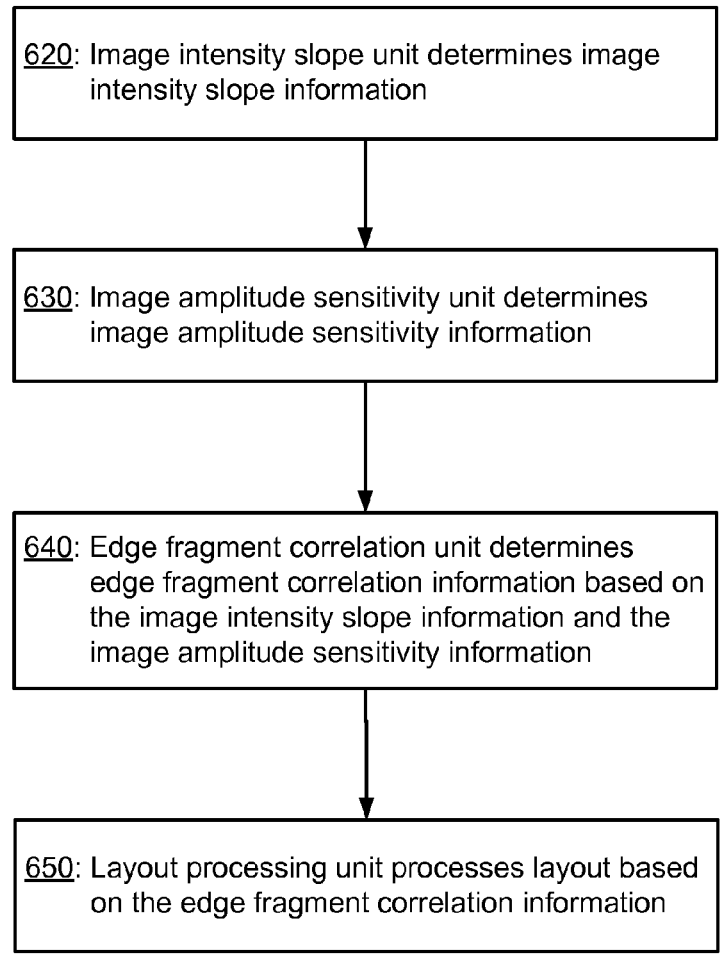
FIG. 6 illustrates a flowchart describing edge fragment correlation determination methods that may be employed by various embodiments of the invention.
Figure 6:
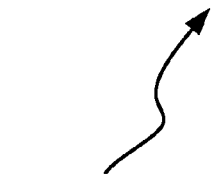

For ease of understanding, edge fragment correlation determination methods that may be employed according to various embodiments of the invention will be described with reference to the edge fragment correlation determination tool 500 illustrated in FIG. 5 and the flow chart 600 in FIG. 6. It should be appreciated, however, that alternate implementations of an edge fragment correlation determination tool may be used to perform the edge fragment correlation determination method shown in the flow chart 500 according to various embodiments of the invention. In addition, it should be appreciated that implementations of the edge fragment correlation determination tool 500 may be employed with methods for edge fragment correlation determination according to different embodiments of the invention other than the one illustrated by the flow chart 600 in FIG. 6.

Initially, in operation 620 of the flow chart 600, the image intensity slope unit 520 determines the image intensity slope information for edge fragments in a layout design. The image intensity slope information includes information describing how image intensity for each of the edge fragments changes with position for the each of the edge fragments. With various implementations of the invention, the image intensity slope information may be represented by the following equation:

$$s = dI/de \qquad [4]$$

where dI and de represent changes of image intensities and EPEs. With some other implementations of the invention, the image intensity slope information may be represented by the following equation:

$$c = \frac{1}{s}\frac{1}{\kappa} 2\mathrm{Re}[(K_1 * f)(x)] \qquad [5]$$

where s is defined by Eq. 4, k is a normalization factor, and $K_1$ is the first SOCS (sum-of-coherent-systems) kernel. The SOCS method may be used for approximating the Hopkins integral while calculating image intensities. The basics of the SOCS method is discussed in N. C. Cobb, "Fast Optical and Process Proximity Correction Algorithms for Integrated Circuit Manufacturing," Ph.D. Dissertation, University of California, Berkeley, 1998, which is incorporated herein by reference. It should be noted that embodiments of the invention are not limited to using the SOCS method for the image intensity calculation. Moreover, while only the first SOCS kernel is shown in Eq. 5, more SOCS kernels may be added if needed.

The image intensity slope unit 520 may determine the image intensity slope information based on Eq. 4. Image intensity information for different positions for an edge fragment may be sampled from the current image intensity profile for the edge fragment. Alternatively, a simulation-based method may be employed by the image intensity slope unit 520. For an edge fragment i, $\Delta e_i$ is the amount of EPE change between two OPC iterations and can be approximated by the following equation:

$$\Delta e_i \approx \sum_{j=1}^{n} \frac{\partial e_i}{\partial F_j} \cdot \overline{\Delta F_j} = \sum_{j=1}^{n} c_i b_{i,j} \overline{\Delta F_j} = c_i \sum_{j=1}^{n} b_{i,j} \overline{\Delta F_j} \qquad [6]$$

where $\partial F_j$ is the displacement of an edge fragment j between the two OPC iterations and $b_{i,j}$ represents image amplitude sensitivity for the edge fragment i with respect to the edge fragment j. $b_{i,j}$ will be discussed in detail below. Eq. 6 can be transformed into:

$$c_i = \frac{\Delta e_i}{\sum_{j=1}^{n} b_{i,j} \overline{\Delta F_j}} \qquad [7]$$

Eq. 7 shows the image intensity slope information may be determined based on information obtained from the previous two OPC iterations.

In operation 630, the mage amplitude sensitivity unit 540 determines image amplitude sensitivity information for the edge fragments. The image amplitude sensitivity information comprises information describing how image amplitude for each of the edge fragments changes with positions of neighboring edge fragments such as $b_{i,j}$. The following equation may be used to define $b_{i,j}$:

$$b_{i,j} := G_\sigma * \Delta F^*_j(x_i) \qquad [8]$$

where $G_\sigma$ is a Gaussian function. The convolution in Eq. 8 may be derived by using the erf function, which can be stored as a small one-dimensional look-up table.

Alternatively, $b_{i,j}$ may be defined as:

$$b_{i,j} := KG_\sigma * \Delta F^*_j(x_i) \qquad [9]$$

where K is the first SOCS kernel. As in the operation 620, more SOCS kernels may be employed by the mage amplitude sensitivity unit 540. While shown as the next operation following the operation 620 in the flow chart 600, the operation 630 may be performed before or simultaneously with the operation 620, as noted in general above.

In operation 640, based on the image intensity slope information and the image amplitude sensitivity information determined by the previous two operations, the edge fragment correlation unit 560 determines edge fragment correlation information for the edge fragments. As noted before, the edge fragment correlation information may comprise off-diagonal elements in a MEEF matrix. The off-diagonal elements (cross-MEEF) may be represented as:

$$\mu_{F_0,F} := \frac{\partial e}{\partial F} = \frac{1}{\frac{dI}{de}} \frac{\delta I}{\delta F} \qquad [10]$$

The last term in Eq. 10 can be expressed as:

$$\delta I(x) := I(m + \delta m; x) - I(m; x) = 2\sum_{\alpha} \mathrm{Re}[(K_\alpha * m)(x) \cdot \overline{(K_\alpha * \delta m)(x)}]. \qquad [11]$$

Accordingly, the off-diagonal elements may be approximated by:

$$\mu_{i,j} \approx c_i b_{i,j} \qquad [12]$$

Therefore, the edge fragment correlation unit 560 may derive the cross-MEEF using the values $c_i$ and $b_{i,j}$ derived in the operations 620 and 630.

Finally, in operation 650, the layout processing unit 580 processes the layout design based on the edge fragment correlation information. The processing may comprise adjusting positions of the edge fragments based on the edge fragment correlation information. With some embodiments of the invention, the operations 620-650 may be incorporated into an OPC process. All layout features are processed based on the edge fragment correlation information. With some other embodiments of the invention, a conventional OPC process is conducted first. Problematic layout regions are identified based on the result of the conventional OPC process. The problematic layout regions may comprise, for example, regions where the desired OPC convergence could not be achieved. Next, a second OPC process comprising the operations 620-650 may be conducted on the identified problematic layout regions.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of edge fragment correlation determination, comprising:
by a computing device:
determining image intensity slope information for edge fragments in a layout design, the image intensity slope information comprising information describing how image intensity for each of the edge fragments changes with a position for the each of the edge fragments;
determining image amplitude sensitivity information for the edge fragments, the image amplitude sensitivity information comprising information describing how image amplitude for each of the edge fragments changes with positions of neighboring edge fragments;
determining off-diagonal elements of a mask error enhancement factor (MEEF) matrix by computing edge fragment correlation information for the edge fragments based on the image intensity slope information and the image amplitude sensitivity information; and
processing the layout design based on the off-diagonal elements.

2. The method recited in claim 1, wherein the determining image intensity slope information comprises:
sampling an image intensity profile to obtain image intensity information for different positions; and
computing image intensity slope information based on the image intensity information for the edge fragment at different locations.

3. The method recited in claim 1, wherein the determining image slope information comprises:
retrieving image intensity information for the edge fragment at different edge displacement error values; and
computing image intensity slope information based on the image intensity information for the edge fragment at different edge displacement error values.

4. The method recited in claim 1, wherein the determining image amplitude sensitivity information comprises employing a Gaussian function.

5. The method recited in claim 4, wherein the Gaussian function is used to approximate a kernel function.

6. The method recited in claim 1, wherein the processing the layout design is an operation for an optical proximity correction process.

7. The method recited in claim 1, wherein the processing the layout design comprises adjusting positions of the edge fragments based on the off-diagonal elements.

8. The method recited in claim 1, wherein the edge fragments are in a hotspot region of the layout design.

9. The method recited in claim 1, wherein the determining image intensity slope information comprises:

obtaining two previous optical process correction (OPC) iterations; and
determining the image intensity slope information based on the two previous OPC iterations.

10. A non-transitory processor-readable medium storing processor-executable instructions for causing one or more processors to perform a method of edge fragment correlation determination, the method comprising:
determining image intensity slope information for edge fragments in a layout design, the image intensity slope information comprising information describing how image intensity for each of the edge fragments changes with a position for the each of the edge fragments;
determining image amplitude sensitivity information for the edge fragments, the image amplitude sensitivity information comprising information describing how image amplitude for each of the edge fragments changes with positions of neighboring edge fragments;
determining off-diagonal elements of a mask error enhancement factor (MEEF) matrix by computing edge fragment correlation information for the edge fragments based on the image intensity slope information and the image amplitude sensitivity information; and
processing the layout design based on the off-diagonal elements.

11. The non-transitory processor-readable medium recited in claim 10, wherein the determining image intensity slope information comprises:
sampling an image intensity profile to obtain image intensity information for different positions; and
computing image intensity slope information based on the image intensity information for the edge fragment at different locations.

12. The non-transitory processor-readable medium recited in claim 10, wherein the determining image slope information comprises:
retrieving image intensity information for the edge fragment at different edge displacement error values; and
computing image intensity slope information based on the image intensity information for the edge fragment at different edge displacement error values.

13. The non-transitory processor-readable medium recited in claim 10, wherein the determining image amplitude sensitivity information comprises employing a Gaussian function.

14. The non-transitory processor-readable medium recited in claim 10, wherein the processing the layout design is an operation for an optical proximity correction process.

15. The non-transitory processor-readable medium recited in claim 10, wherein the edge fragments are in a hotspot region of the layout design.

16. A system comprising one or more processors, the one or more processors programmed to perform a method of edge fragment correlation determination, the method comprising:
determining image intensity slope information for edge fragments in a layout design, the image intensity slope information comprising information describing how image intensity for each of the edge fragments changes with a position for the each of the edge fragments;
determining image amplitude sensitivity information for the edge fragments, the image amplitude sensitivity information comprising information describing how image amplitude for each of the edge fragments changes with positions of neighboring edge fragments;
determining off-diagonal elements of a mask error enhancement factor (MEEF) matrix by computing edge fragment correlation information for the edge fragments based on the image intensity slope information and the image amplitude sensitivity information; and processing the layout design based on the off-diagonal elements.

17. The system recited in claim 16, wherein the determining image intensity slope information comprises:

sampling an image intensity profile to obtain image intensity information for different positions; and computing image intensity slope information based on the image intensity information for the edge fragment at different locations.

18. The system recited in claim 16, wherein the determining image slope information comprises:

retrieving image intensity information for the edge fragment at different edge displacement error values; and computing image intensity slope information based on the image intensity information for the edge fragment at different edge displacement error values.

19. The system recited in claim 16, wherein the determining image amplitude sensitivity information comprises employing a Gaussian function.

20. The system recited in claim 16, wherein the processing the layout design is an operation for an optical proximity correction process.

21. The system recited in claim 16, wherein the edge fragments are in a hotspot region of the layout design.

* * * * *